United States Patent
Cho et al.

(10) Patent No.: US 7,629,205 B2
(45) Date of Patent: Dec. 8, 2009

(54) THIN FILM TRANSISTOR HAVING DOUBLE-LAYERED GATE ELECTRODE AND METHOD OF MANUFACTURING THE THIN FILM TRANSISTOR

(75) Inventors: Hans S. Cho, Seoul (KR); Hyuck Lim, Seoul (KR); Takashi Noguchi, Seongnam-si (KR); Jang-yeon Kwon, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 320 days.

(21) Appl. No.: 11/330,344

(22) Filed: Jan. 12, 2006

(65) Prior Publication Data

US 2006/0157787 A1    Jul. 20, 2006

(30) Foreign Application Priority Data

Jan. 13, 2005    (KR)    ............... 10-2005-0003192

(51) Int. Cl.
    H01L 21/00    (2006.01)
(52) U.S. Cl. .............. 438/149; 438/582; 438/656; 257/388; 257/412
(58) Field of Classification Search .......... 257/388, 257/412; 438/582, 648, 656, 685, 149
    See application file for complete search history.

(56) References Cited

U.S. PATENT DOCUMENTS

| | | | |
|---|---|---|---|
| 6,255,705 B1* | 7/2001 | Zhang et al. | 257/412 |
| 7,119,022 B2* | 10/2006 | Uehara et al. | 438/713 |
| 2002/0013021 A1* | 1/2002 | Jeong et al. | 438/149 |
| 2002/0142554 A1* | 10/2002 | Nakajima | 438/301 |
| 2003/0027382 A1* | 2/2003 | Uehara et al. | 438/200 |
| 2004/0183024 A1* | 9/2004 | Choo et al. | 250/370.09 |
| 2004/0224514 A1* | 11/2004 | Uehara et al. | 438/689 |
| 2005/0051773 A1* | 3/2005 | Nakajima | 257/66 |
| 2006/0145255 A1* | 7/2006 | Jeong et al. | 257/347 |

FOREIGN PATENT DOCUMENTS

| | | |
|---|---|---|
| JP | 2002-026332 A | 1/2002 |
| KR | 2002-0048487 A | 6/2002 |

OTHER PUBLICATIONS

Notice to Submit Response issued by the Japanese Patent Office on Sep. 22, 2006, in corresponding Japanese Patent Application No. 10-2005-0003192; and English translation thereof.

* cited by examiner

*Primary Examiner*—Fernando L Toledo
(74) *Attorney, Agent, or Firm*—Buchanan Ingersoll & Rooney PC

(57) ABSTRACT

A thin film transistor (TFT) that can prevent damage to a silicon layer under a gate electrode in an annealing process by using a first gate electrode having high thermal resistance and a second gate electrode having high reflectance and a method of manufacturing the TFT are provided. The method of manufacturing a TFT includes forming a double-layered gate electrode which includes a first gate electrode formed of a material having high thermal resistance and a second gate electrode formed of a metal having high optical reflectance on the first gate electrode, and forming a source and a drain by annealing doped regions on both sides of a silicon layer under the gate electrode by radiating a laser beam onto the entire upper surface of the silicon layer.

11 Claims, 4 Drawing Sheets

THIN FILM TRANSISTOR HAVING DOUBLE-LAYERED GATE ELECTRODE AND METHOD OF MANUFACTURING THE THIN FILM TRANSISTOR

CROSS-REFERENCE TO RELATED PATENT APPLICATION

This application claims the benefit of Korean Patent Application No. 10-2005-0003192, filed on Jan. 13, 2005, in the Korean Intellectual Property Office, the disclosure of which is incorporated herein in its entirety by reference.

BACKGROUND OF THE DISCLOSURE

1. Field of the Disclosure

The present disclosure relates to a thin film transistor (TFT) having a double layered gate contact and a method of manufacturing the TFT, and more particularly, to a TFT that can prevent damage to a silicon layer under a gate electrode in a annealing process by using a first gate having high thermal resistance and a second gate having high reflectance and a method of manufacturing the TFT.

2. Description of the Related Art

FIG. 1 is a cross-sectional view illustrating a structure of a conventional TFT. Referring to FIG. 1, a conventional TFT includes a buffer layer 11 formed on a substrate 10, a silicon layer 12 formed on the buffer layer 11, a source and drain 17 and 18 respectively formed on both sides of the silicon layer 12, an insulating layer 15 formed on a center of an upper surface of the silicon layer 12, and a gate electrode 16 formed on the insulating layer 15. Also, the silicon layer 12 serves as a channel region between the source and drain 17 and 18. Therefore, to increase the mobility of charge in the channel region, after amorphous silicon is formed on the buffer layer 11, the amorphous silicon is crystallized to form the silicon layer.

The source 17 and the drain 18 are formed by doping the sides 13 and 14 of the crystallized silicon layer 12 with dopants. An ion implanting method that forcibly implants ionized atoms into silicon by accelerating the ionized atoms is mainly used to achieve the implantation of a dopant into the source and drain regions. However, when the ion implanting method used for doping a dopant, crystal defects are generated in the silicon crystal lattices due to the dopant being implanted into the silicon. Therefore, an annealing process is required to electrically activate the doped region by removing the crystal defects and matching a lattice of silicon with that of the dopants.

FIG. 2 is a cross-sectional view illustrating an annealing process using a laser beam. Referring to FIG. 2, when a laser beam is radiated from a laser, such as an excimer laser, to an upper surface of a TFT, the exposed doped regions 13 and 14 are heated by the laser beam. When a laser beam is used for annealing, annealing can be performed even at room temperature since the laser beam directly heats the doped regions 13 and 14. Therefore, when annealing is performed using a laser beam, a material that has a low heat tolerance, such as plastic, may be used to form the substrate.

In an annealing process using a laser beam, the gate electrode 16 serves as a mask that blocks the laser beam so as not to irradiate to the silicon layer 12. To prevent the silicon layer 12 from being damaged by the laser beam, it is preferable that the gate electrode 16 completely reflects the laser beam. However, the gate electrode 16 is usually formed of chrome Cr, and chrome has relatively low reflectance and absorbs thermal energy. Therefore, the gate electrode 16 formed of chrome absorbs the thermal energy of the laser beam and transmits the thermal energy to the insulating layer 15 and the silicon layer 12, which are formed below the gate electrode, while annealing the doping regions 13 and 14.

As a result, as depicted in FIG. 3, the insulating layer 15 and the silicon layer 12 partly melts. FIG. 3 is a SEM image of a TFT from which the gate electrode 16 is removed after annealing. In FIG. 3, a trace of the gate electrode 16 in a rectangular shape was left, and the insulating layer 15 and the silicon layer 12 formed under the gate electrode 16 partly melted. As a result, the gate electrode 16 and the silicon layer 12 may not be completely insulated from each other and the charge mobility of a channel region between the source and drain 17 and 18 may greatly decrease due to the deformation of the silicon layer 12.

SUMMARY OF THE DISCLOSURE

The present invention may provide a method of manufacturing a TFT that can prevent damaging of an insulating layer and a silicon layer under a gate electrode during an annealing process of a doped region using a laser beam and a structure of the gate electrode of the TFT.

According to an aspect of the present invention, there maybe provided a method of manufacturing a thin film transistor (TFT) by forming a source and a drain by annealing doped regions on both sides of a silicon layer formed under a gate electrode, wherein the gate electrode is a double-layered gate electrode which includes a first gate electrode formed of a thermal resistance material and a second gate electrode formed of a light reflective metal on the first gate electrode, and the doped regions are annealed by radiating a laser beam onto the entire upper surface of the silicon layer.

According to the present invention, the first gate electrode can be formed of at least a material selected from the group consisting of chrome Cr, molybdenum Mo, and doped silicon and the second gate electrode can be formed of Al or Al-alloy. The thickness of the second gate electrode may be no more than approximately 500 Å.

Also, the silicon layer can be formed of mono crystalline silicon or polycrystalline silicon.

According to another aspect of the present invention, there is provided a method of manufacturing a TFT comprising: sequentially stacking a buffer layer and a silicon layer on a substrate; forming an insulating layer partly on a central portion of an upper surface of the silicon layer; forming a first gate electrode of a thermal resistance material on the insulating layer; forming a second gate electrode of an light reflective metal on the first gate electrode; doping both sides of the silicon layer with a dopant; and forming a source and a drain by annealing the doped regions on both sides of the silicon layer by radiating a laser beam onto the entire upper surface of the silicon layer.

According to another aspect of the present invention, there is provided a TFT comprising: a source and a drain formed by doping both sides of a silicon layer with a dopant; an insulating layer formed on an upper central portion of an upper surface of the silicon layer; and a gate electrode formed on the insulating layer, wherein the gate electrode is a double-layered gate electrode which includes a first gate electrode formed of a thermal resistance material and a second gate electrode formed of a light reflective metal on the first gate electrode.

According to another aspect of the present invention, there is provided a TFT comprising: a substrate; a buffer layer formed on the substrate; a silicon layer formed on the buffer layer; a source and a drain formed by doping both sides of the silicon layer with a dopant; an insulating layer formed on a central portion of an upper surface of the silicon layer; and a double-layered gate electrode formed on the insulating layer, wherein the double-layered gate electrode includes a first gate electrode formed of a thermal resistance material and a second gate electrode formed of a light reflective metal on the first gate electrode.

BRIEF DESCRIPTION OF THE DRAWINGS

The above and other features and advantages of the present invention are described in greater detail in exemplary embodiments thereof with reference to the attached drawings in which.

DETAILED DESCRIPTION OF EXEMPLARY EMBODIMENTS

Figure 1:
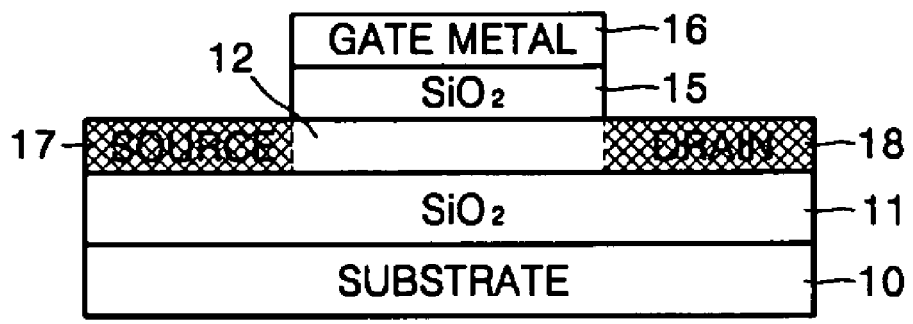
FIG. 1 is a cross-sectional view illustrating a structure of a conventional TFT.
Figure 2:
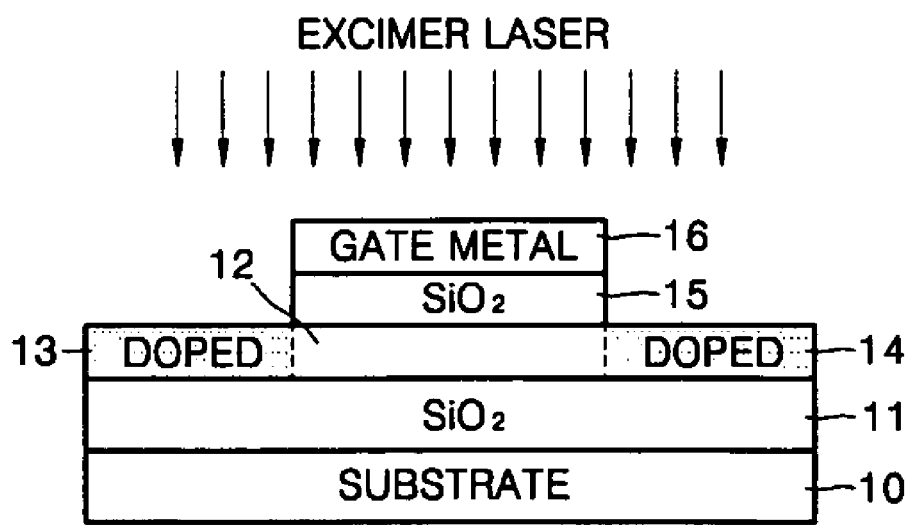
FIG. 2 is a cross-sectional view illustrating a doped region annealing process in the manufacture of a conventional TFT.
Figure 3:
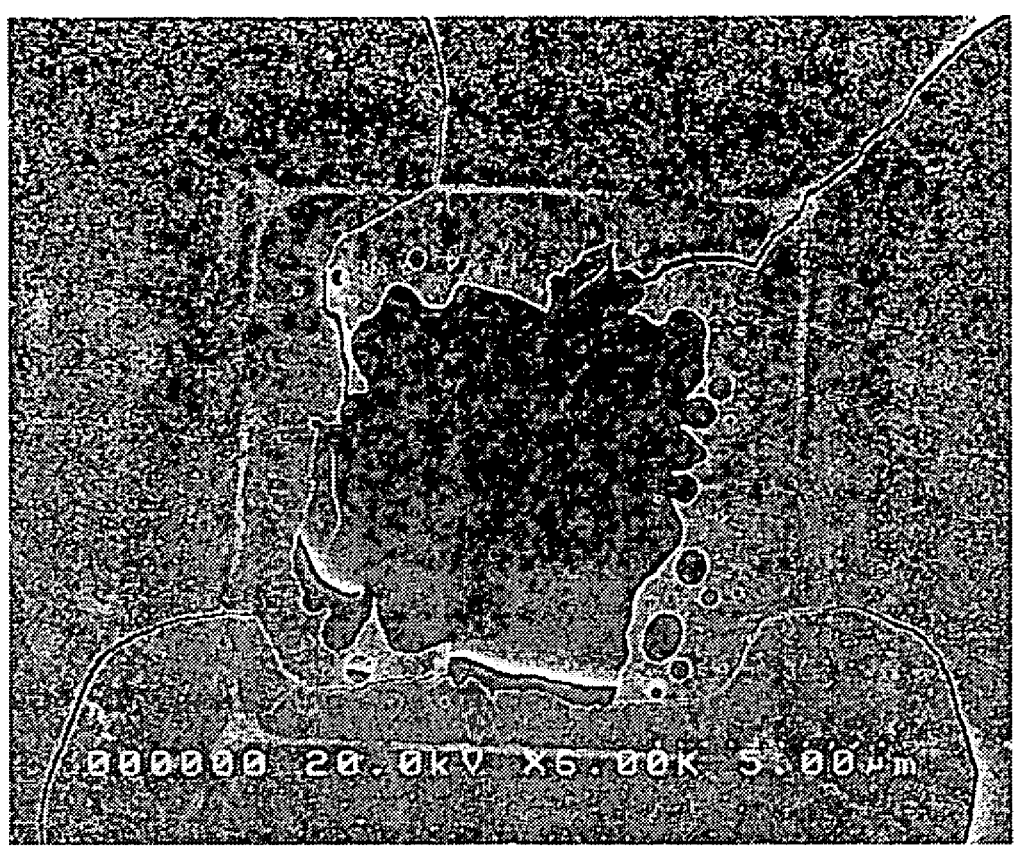
FIG. 3 is a SEM image of a deformed silicon layer under a gate electrode in the TFT of FIG. 1.
Figure 4:
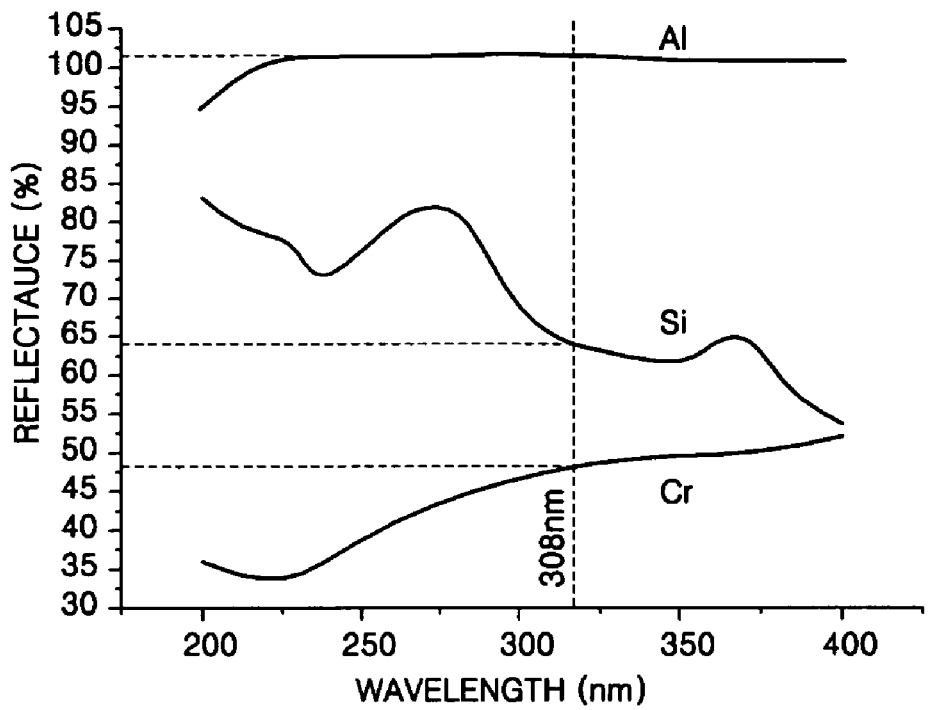
FIG. 4 is a graph showing reflectance value of several materials versus a wavelength.

As described above in relation with the prior art, in a conventional TFT, a gate electrode mainly formed of chrome Cr has relatively low reflectance and characteristics for absorbing heat. Ideally, the gate electrode is required to completely reflect a laser beam. FIG. 4 is a graph showing reflectance value of several materials versus a wavelength. Referring to FIG. 4, the reflectance of chrome Cr with respect to a laser beam in an ultraviolet range with a wavelength of approximately 308 nm which is mainly used in annealing does not reach even 50%. On the other hand, the reflectance of silicon Si is approximately 60%, and that of aluminium Al is almost 100%.

From the graph of FIG. 4, aluminium Al can be considered as a material for a gate electrode. However, aluminium Al has a very low melting point, such as approximately 660° C. Considering that the annealing using a laser beam operates at approximately 300-500° C. as described above, a gate electrode formed of aluminium Al may melt or may be at least deformed even though it does not melt. If the gate electrode is deformed or melted during annealing, the performance of a completed TFT may be reduced, for example, a short circuit with neighbouring source or drain electrodes may occur.

Therefore, the present invention provides a double-layered gate electrode in which a first gate electrode formed of a heat resisting material and a second gate electrode formed of a material having high reflectance are included.

Figure 5:
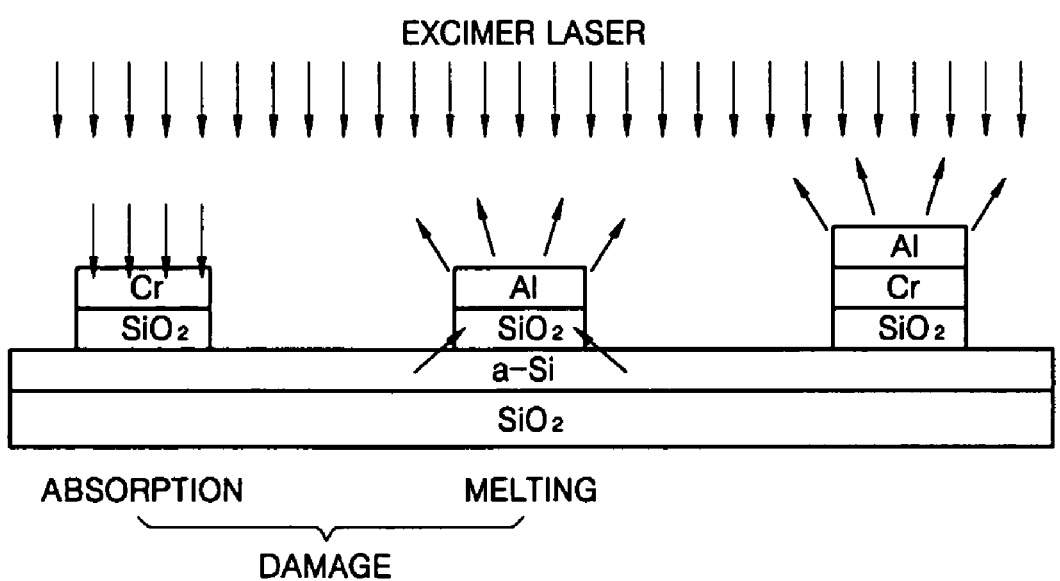
FIG. 5 is a cross-sectional view illustrating three embodiments of gate electrodes formed of chrome Cr, aluminum Al, and chrome/aluminum Cr/Al.

In FIG. 5, a single-layered electrode formed of chrome Cr, a single-layered electrode formed of aluminium Al, and a double-layered electrode formed of chrome Cr/aluminium Al, which are used as a gate electrode, are depicted. Referring to FIG. 5, when the gate electrode is formed of only chrome Cr, an insulating layer and a silicon layer under the gate electrode may melt since the gate electrode does not reflect a laser beam and absorbs the energy of the laser beam. Also, when the gate electrode is formed of only aluminium Al, the gate electrode does reflect the laser beam but the gate electrode itself may be damaged due to the low melting point of aluminium Al.

On the other hand, as in the present invention, when the first gate electrode formed of chrome Cr is formed on the insulating layer, and the second gate electrode formed of aluminium Al is formed on the first gate electrode, the above problems can be alleviated. That is, in the case of the double-layered gate electrode according to the present invention, the second gate electrode having high reflectance prevents the first gate electrode from being overheated by reflecting the laser beam. The first gate electrode having high thermal resistance and high heat absorptiveness can cool the second gate electrode by absorbing the heat of the second gate electrode. In this case, heat absorbed by the first gate electrode is very small compared to when there is no second gate electrode since the second gate electrode reflects most of the laser beam. Therefore, damage to an insulating layer and a silicon layer under the gate electrode due to the overheated first gate electrode does not occur.

Figure 6A:
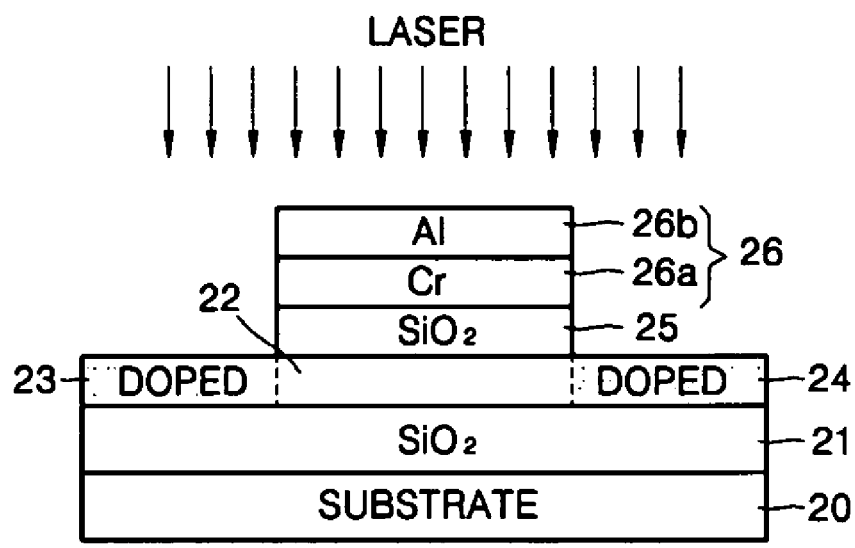
FIGS. 6A and 6B are cross-sectional views illustrating respectively a method of manufacturing a TFT according to an embodiment of the present invention and a structure of the manufactured TFT.
Figure 6B:
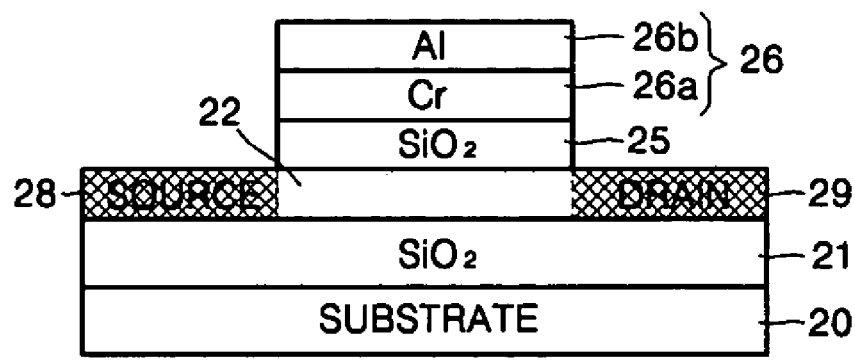

FIGS. 6A and 6B are cross-sectional views illustrating respectively a method of manufacturing a TFT using the double-layered gate electrode according to the present invention and a structure of the manufactured TFT according to the present invention.

The method of manufacturing a TFT according to the present invention will now be described with reference to FIG. 6A. A buffer layer 21 is formed on a substrate 20. The substrate 20 can be formed of silicon, glass, or plastic. The buffer layer 21 can be formed of silicon oxide $SiO_2$. A silicon layer 22 of polycrystalline silicon or mono crystalline silicon is formed on the buffer layer 21. The silicon layer 22 is formed by crystallizing amorphous silicon on the buffer layer 21 through an annealing process. Afterward, an insulating layer 25 is formed on a central portion of an upper surface of the silicon layer 22. Next, a double-layered gate electrode 26 is formed on the insulating layer 25. The insulating layer may be formed of silicon oxide $SiO_2$.

As described above, the double-layered gate electrode 26 is composed of a first gate electrode 26a having high thermal resistance and a second gate electrode 26b having high reflectance. The first gate electrode 26a may be formed of chrome Cr, molybdenum Mo, or doped silicon Si having electric conductivity. The second gate electrode 26b may be formed of aluminium Al or an Al-alloy. The second gate electrode 26b does not need to be thick since the second gate electrode 26b only has to reflect the laser beam. Hence, even a thickness of about 500 Å or less is sufficient.

Afterward, both sides of the silicon layer 22 are doped with an n-type or p-type dopant. The n-type dopant may be phosphorus P, and the p-type dopant may be boron B. Next, to electrically activate doped regions 23 and 24 by matching lattices between silicon and the dopant, a laser beam is radiated to the entire upper surface of the silicon layer 22. Accordingly, as depicted in FIG. 6B, a source 28 and a drain 29 are formed by annealing the doped regions 23 and 24 on both sides of the silicon layer 22. In the annealing process where a laser beam is radiated, the temperature of the first gate electrode 26a is kept relatively low since the second gate electrode 26b sufficiently reflects the laser beam. Therefore, the insulating layer 25 and the silicon layer 22 under the first gate electrode 26a are not damaged during the annealing process.

A method of manufacturing a TFT having a double-layered gate electrode according to the present invention and a structure of the TFT have described. As can be seen from the detailed descriptions, the described conventional problems are overcome by using the double-layered gate electrode, which is composed of a first gate electrode having high thermal resistance and a second gate electrode having high reflectance. That is, in the double-layered gate electrode according to the present invention, the first gate electrode is prevented from overheated by the laser beam reflection of the second gate electrode having high reflectance. The first gate electrode having high thermal resistance and a high heat absorptiveness can cool the second gate electrode by absorbing the heat of the second gate electrode. In this case, heat absorbed by the first gate electrode is very small compared to when there is no second gate electrode, since the second gate electrode reflects most of the laser beam. Therefore, the insulating layer and the silicon layer under the first gate electrode are not damaged during the annealing process.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a thin film transistor (TFT) by forming a source and a drain by annealing doped regions on both sides of a silicon layer formed under a gate electrode,
    wherein the gate electrode is a double-layered gate electrode which includes a first gate electrode formed of a thermal resistance metal and a second gate electrode formed of a light reflective metal on the first gate electrode, and the doped regions are annealed by radiating a laser beam onto the entire upper surface of the silicon layer,
    wherein the first gate electrode is formed of chrome Cr or molybdenum Mo, and wherein the second gate electrode is formed of aluminium Al or an Al-alloy.

2. The method of claim 1, wherein a thickness of the second gate electrode is no more than approximately 500 Å.

3. The method of claim 1, wherein the silicon layer is formed of one of mono crystalline silicon and polycrystalline silicon, wherein the doped regions are annealed by radiating a laser beam onto the entire upper surface of the silicon layer including radiating the laser beam onto the light reflective metal on the first gate electrode, and wherein the light reflective metal reflects the laser beam.

4. A method of manufacturing a TFT comprising:
    sequentially stacking a buffer layer and a silicon layer on a substrate;
    forming an insulating layer partly on a portion of an upper surface of the silicon layer;
    forming a first gate electrode of a thermal resistance metal on the insulating layer;
    forming a second gate electrode of a light reflective metal on the first gate electrode;
    doping both sides of the silicon layer with a dopant; and
    forming a source and a drain by annealing the doped regions on both sides of the silicon layer by radiating a laser beam onto the entire upper surface of the silicon layer,
    wherein the first gate electrode is formed of chrome Cr or molybdenum Mo, and wherein the second gate electrode is formed of aluminium Al or an Al-alloy.

5. The method of claim 4, wherein the buffer layer and the insulating layer include silicon oxide $SiO_2$.

6. A TFT comprising:
    a source and a drain formed by doping both sides of a silicon layer with a dopant;
    an insulating layer formed on an upper portion of an upper surface of the silicon layer; and
    a gate electrode formed on the insulating layer, wherein the gate electrode is a double-layered gate electrode which includes a first gate electrode formed of a thermal resistance metal and a second gate electrode formed of a light reflective metal on the first gate electrode,
    wherein the first gate electrode is formed of chrome Cr or molybdenum Mo, and wherein the second gate electrode is formed of aluminium Al or an Al-alloy.

7. The TFT of claim 6, wherein a thickness of the second gate electrode is no more than approximately 500 Å.

8. The TFT of claim 6, wherein the silicon layer is formed of one of mono crystalline silicon and polycrystalline silicon, wherein the doped regions are annealed by radiating a laser beam onto the entire upper surface of the silicon layer including radiating the laser beam onto the light reflective metal on the first gate electrode, and wherein the light reflective metal reflects the laser beam.

9. A TFT comprising:
    a substrate;
    a buffer layer formed on the substrate;
    a silicon layer formed on the buffer layer;
    a source and a drain formed by doping both sides of the silicon layer with a dopant;
    an insulating layer formed on a portion of an upper surface of the silicon layer; and
    a double-layered gate electrode formed on the insulating layer,
    wherein the double-layered gate electrode includes a first gate electrode formed of a thermal resistance metal and a second gate electrode formed of a light reflective metal on the first gate electrode,
    wherein the first gate electrode is formed of chrome Cr or molybdenum Mo, and wherein the second gate electrode is formed of aluminium Al or an Al-alloy.

10. The TFT of claim 9, wherein the silicon layer is formed of one of mono crystalline silicon and polycrystalline silicon, wherein the doped regions are annealed by radiating a laser beam onto the entire upper surface of the silicon layer including radiating the laser beam onto the light reflective metal on the first gate electrode, and wherein the light reflective metal reflects the laser beam.

11. The TFT of claim 9, wherein a thickness of the second gate electrode is no more than approximately 500 Å.

* * * * *